United States Patent [19]
Brown et al.

[11] Patent Number: 5,394,005
[45] Date of Patent: Feb. 28, 1995

[54] SILICON CARBIDE PHOTODIODE WITH IMPROVED SHORT WAVELENGTH RESPONSE AND VERY LOW LEAKAGE CURRENT

[75] Inventors: Dale M. Brown, Schenectady, N.Y.; John A. Edmond, Apex, N.C.

[73] Assignee: General Electric Company, Schenectady, N.Y.

[21] Appl. No.: 198,679

[22] Filed: Feb. 18, 1994

Related U.S. Application Data

[63] Continuation of Ser. No. 878,937, May 5, 1992, abandoned.

[51] Int. Cl.$^6$ .................... H01L 27/14; H01L 31/00
[52] U.S. Cl. ..................................... 257/461; 257/466
[58] Field of Search ................................ 257/461, 466

[56] References Cited

U.S. PATENT DOCUMENTS

| | | | |
|---|---|---|---|
| 3,565,703 | 2/1971 | Kamath | 148/172 |
| 3,712,709 | 1/1973 | Kenworthy | 350/160 |
| 3,767,980 | 10/1973 | Kamath | 317/235 |
| 3,773,553 | 11/1973 | Kamath | 117/201 |
| 4,244,759 | 1/1981 | Petersson et al. | 257/461 |
| 4,367,368 | 1/1983 | Wolf | 257/461 |
| 4,395,583 | 7/1983 | Meulenberg, Jr. | 257/461 |
| 4,487,989 | 12/1984 | Wakefield et al. | 136/256 |
| 4,531,142 | 7/1985 | Weyrich et al. | 357/17 |
| 4,590,327 | 5/1986 | Nath et al. | 136/256 |
| 4,633,030 | 12/1986 | Cook | 136/246 |
| 4,739,383 | 4/1988 | Maruska et al. | 357/30 |
| 4,832,459 | 5/1989 | Harper et al. | 350/345 |
| 4,918,497 | 4/1990 | Edmond | 357/17 |
| 4,947,218 | 8/1990 | Edmond et al. | 357/13 |
| 5,027,168 | 6/1991 | Edmond | 357/17 |
| 5,061,972 | 10/1991 | Edmond | 257/603 |
| 5,093,576 | 3/1992 | Edmond et al. | 250/370.01 |

OTHER PUBLICATIONS

Muller et al., *Device Electronics for IC's*, pp. 235–242, 1986.
D. M. Brown et al., "Silicon Carbide UV Photodiodes", Transactions of the First International High Temperature Electronics Conference, Albuquerque, N. Mex., Jun. 16–20, 1991; pp. 214–219.
D. G. Fink et al., Electronic Engineers' Handbook 3rd Edition [©1989; McGraw Hill, New York], pp. 10–42.
P. Glasow et al., "SiC-UV Photodetectors", SPIE 868, Optoelectronic Technologies for Remote Sensing from Space, pp. 40–45, 1987.

*Primary Examiner*—Andrew J. James
*Assistant Examiner*—Stephen D. Meier
*Attorney, Agent, or Firm*—Marvin Snyder

[57] ABSTRACT

A silicon carbide photodiode exhibiting high short-wavelength sensitivity, particularly in the ultraviolet spectrum, and very low reverse leakage current includes a p type conductivity 6H crystalline substrate. A first p— silicon carbide crystalline layer is epitaxially grown on the body. A second n+ silicon carbide crystalline layer is epitaxially grown on the first layer and forms a p—/n+ junction with the first layer. A metallic upper contact layer is formed on a predetermined surface region of the second layer oppositely situated from the junction. The second layer is of a uniform minimum thickness, generally less than 1000 Angstroms, with a greater thickness, typically 3000–4000 Angstroms, beneath the predetermined surface region. The thicker portion of the second layer occupies less than 10% and generally less than 1% of the total second layer surface area. Hence optical sensitivity of the photodiode is essentially determined by the thinner portion of the second layer, while the thicker portion of this layer is made sufficiently large to prevent diffusion of upper contact layer metal into the vicinity of the junction during contact sintering or alloying operations.

20 Claims, 6 Drawing Sheets

SILICON CARBIDE PHOTODIODE WITH IMPROVED SHORT WAVELENGTH RESPONSE AND VERY LOW LEAKAGE CURRENT

This application is a continuation of application Ser. No. 07/878,937 filed May 5,1992 abandoned.

BACKGROUND OF THE DISCLOSURE

1. Field of the Invention

This invention relates to photodiodes and, more particularly, to a silicon carbide photodiode which contains multiple epitaxially grown layers and exhibits high short-wavelength sensitivity, particularly in the ultraviolet spectrum, and very low reverse leakage current.

2. Description of the Prior Art

Currently, flame detectors find use in a wide variety of applications. Such applications include use in jet engines and gas turbines.

In particular, one such illustrative application involves detecting whether an afterburner in a jet engine is operating or not. In this application, a Geiger-Mueller tube has been and still is typically used as the detector. The tube is positioned to monitor an exhaust plume of the engine. Apart from the relatively large physical size of such tubes and the disadvantageous associated need for a high voltage transformer and ancillary circuitry, the performance of a Geiger-Mueller tube degrades with increasing temperature which, in turn, tends to limit the utility of these tubes with modern jet engines. Specifically, a Geiger-Mueller tube is a tube that has been filled with an ionizable gas. Optical emission produced by a jet engine flame, for example, causes a localized discharge to occur within the gas and eventually spread across the entire length of the anode contained in the tube. This discharge phenomenon causes the tube to produce an output pulse. For further details of the operation of these tubes, see, e.g., section 85 at page 10–42 of D. G. Fink et al., Electronic Engineers' Handbook, 3rd Edition, 1989, McGraw Hill, New York. As temperature of the tube rises, particularly above 200° C. the heat experienced by the tube causes the gas to begin to self-ionize which, in turn, causes performance of the tube to begin degrading. Inasmuch as modern jet engines are being operated at increasingly higher temperatures, which also raise the temperature of the housing of the engine and that of the detector affixed thereto, flame detectors are now needed which can tolerate temperatures of 200°–400° C. Unfortunately, Geiger-Mueller tubes cannot perform adequately at these elevated temperatures. There is need, therefore, to replace the Geiger-Mueller tubes in jet engine flame detectors with appropriate detectors that will properly function at such elevated temperatures.

An optical detector that appears to exhibit excellent promise for use at such high temperatures is a silicon carbide photodiode. One such photodiode is shown and described in J. A. Edmond et al. U.S. Pat. No. 5,093,576, "High Sensitivity Ultraviolet Radiation Detector", issued Mar. 3, 1992.

Silicon carbide is a compound semiconductor that exists in a relatively large number of different crystalline forms, of which the 6H form (with "H" representing hexagonal crystalline packing) is the most readily available. Advantageously, the 6H form of silicon carbide exhibits a relatively wide band gap of approximately 3.0 electron volts. Such a wide band gap permits a 6H silicon carbide photodiode to possess excellent sensitivity to ultraviolet radiation, as well as low leakage current. In this regard, an ordinary silicon diode operating at 300° C. possesses leakage current on the order of 10 mA/cm$^2$, while a 6H silicon carbide diode operating at the same temperature exhibits leakage current on the order of 1–10 nA/cm$^2$, which is advantageously some six orders of magnitude less. Furthermore, owing to the wide band gap, a 6H silicon carbide photodiode would be substantially, if not totally, transparent to both infrared and visible light. In this regard, such photodiode begins to exhibit optical sensitivity to applied light at wavelengths of approximately 400 nm and exhibits a peak response at approximately 270 nm. Accordingly, such detector could readily discern ultraviolet radiation that exists in the presence of a strong background of intense infrared and/or visible light. As such, one would expect that the detector would readily respond to the ultraviolet emission produced by a flame in a jet engine while effectively ignoring all the infrared and visible radiation emitted by the heated parts of the engine itself.

While the above benefits attainable from silicon carbide photodiodes would clearly make them superior in high temperature applications to other types of photodetectors, practical realization of silicon carbide photodiodes has been very problematic at best.

In particular, silicon carbide diodes are currently manufactured using either of two basic techniques: ion implantation or epitaxial growth. Through ion implantation, silicon carbide diodes have been fabricated to contain a very shallow n+/p junction (approximately 500 Angstroms deep) formed by nitrogen implantation in a p type conductivity epitaxial layer. See, for example, P. Glasow et al., "SiC-UV Photodetectors", SPIE 868, Optoelectronic Technologies for Remote Sensing from Space, pp. 40–45, 1987. Although the quantum efficiency of these diodes was found to be relatively high in a 200–400 nm wavelength region, ion implantation caused significant crystal damage. Unfortunately, this damage not only proved to be extremely difficult to anneal but, more importantly, also caused these diodes to exhibit excessively high reverse leakage current. For example, at 300° C., ion implanted silicon carbide diodes exhibited leakage currents on the order of between 1–10 mA/cm$^2$. Such high leakage currents are well in excess of what can be tolerated in a photodiode.

Given the drawbacks, particularly the excessively high leakage currents, associated with shallow junction silicon carbide diodes manufactured using ion implantation, epitaxial growth has emerged in the art as a favored process to produce silicon carbide diodes. However, as will now be seen, even this process, as least as it is currently applied in the art, can be improved upon as evidenced by the present invention.

Typically, as known in the art, a silicon carbide diode manufactured using epitaxial growth begins with either a 6H n or p type conductivity substrate. If an n type conductivity substrate is used, then a heavily doped p+ layer, of approximately 1 μm in thickness, is epitaxially grown over the substrate. A lightly doped p type layer (i.e. a p− layer), between approximately 1 and 5 μm in thickness and typically using aluminum as the dopant, is then grown over the p+ layer. Alternatively, if a p type substrate is used, then the p− layer is grown directly over the substrate. The thickness of the p− layer can be set to a value between 1 and 5 μm depending upon the desired optical sensitivity of the diode. In particular, owing to the relatively low optical coefficient of absorption of silicon carbide, a relatively thick p− layer is used in order to increase the sensitivity of the resulting photodiode to long ultraviolet wavelengths, while this p− layer is made relatively thin—particularly if the diode is to be used as a flame detector—to decrease sensitivity of the diode to long ultraviolet wavelengths and thus decrease its sensitivity to solar radiation occurring between 300 and 400 nm. Next, to form a junction, an n+ layer, typically using nitrogen as the dopant, is epitaxially grown at a uniform thickness over the p− layer. A metallic contact is then formed on top of the n+ layer. A metallic contact is also made to the back side of the p type substrate or, if an n type substrate is being used, to an exposed portion of the top of the p+ layer.

In order to increase sensitivity of the resulting silicon carbide photodiode to short ultraviolet wavelengths, particular those that exist in jet fuel combustion, the heavily doped n+ epitaxial layer would need to be made quite thin, typically on the order of 1000 Angstroms or less. Unfortunately, in practice, placing a metallic contact onto such thin layer can cause so-called "contact spiking" to occur, resulting in excessively high diode leakage current. Specifically, silicon carbide crystals, unlike pure silicon, are not defect-free. In fact, silicon carbide crystals generally contain so-called micro-defects. Whenever a metallic layer is alloyed or sintered onto such a crystalline silicon carbide layer in order to produce a good ohmic contact, the metal seeks out and diffuses into the defects in the crystalline layer. Unfortunately, if the n+ layer is relatively thin, as is taught in the art to increase the short wavelength sensitivity of the resulting diode, then the metal can migrate through this layer. The very leaky diode caused by this "contact spiking" is unacceptable for use as an accurate flame detector.

Faced with this deficiency, it appears that a relatively thick n+ layer must be used to avoid contact spiking but at the expense of reducing the sensitivity at 280 nm and below. In fact, if the n+ layer is made too thick, then the short ultraviolet wavelength sensitivity, desirable for use in a flame detector for a jet engine, would be lost.

In view of this background, it is apparent that a need exists in the art for a silicon carbide photodiode which contains multiple epitaxially grown layers and exhibits both high short-wavelength sensitivity, particularly to short ultraviolet illumination, and very low reverse leakage current. Such photodiode should find ready acceptance as an accurate high temperature photodiode and, advantageously, as an accurate flame detector for use in a jet engine, gas turbine or other high temperature environment.

SUMMARY OF THE INVENTION

One object of the present invention is to provide a photodiode that is useful as a flame detector.

Another object is to provide a silicon carbide photodiode having relatively low reverse leakage current.

Another object is to provide a silicon carbide photodiode that exhibits excellent short ultraviolet wavelength sensitivity without appreciable contact spiking.

Briefly, in accordance with a preferred embodiment of the invention, a silicon carbide photodiode is fabricated from a crystalline body, such as a 6H type silicon carbide substrate of p type conductivity. A first crystalline layer, typically p− silicon carbide, is epitaxially grown on the body. A second crystalline layer, typically n+ silicon carbide, is epitaxially grown on the first layer and forms a junction between the first and second layers. A metallic upper contact layer is formed on a predetermined surface region of the second layer oppositely situated from the junction. The second layer has a uniform minimum thickness, generally less than 1000 Angstroms, surrounding a steeply enlarged thickness under this surface region so as to provide a total thickness of typically 3000–4000 Angstroms under this surface region. This steep enlargement in thickness is accomplished by epitaxially growing the second layer to the desired enlarged thickness and then selectively patterning this layer back to the minimum thickness in regions other than those that will directly support the upper metallic contact layer. The second layer, in cross-section, now resembles a mesa structure. The portion of the second layer comprising the mesa structure generally accounts for less than 10% and typically less than 1%, of the total upper surface area of this layer. Advantageously, with this overall structure, optical sensitivity of the photodiode is essentially determined by the thinner portion of the second layer, while the thicker portion of this layer is sufficiently large to prevent upper contact layer metal from diffusing into the vicinity of the junction during contact alloying or sintering operations.

The photodiode of this invention can be fabricated from either an n or p type conductivity silicon carbide substrate by utilizing as the crystalline body either a p type substrate alone or an n type substrate with a p+ silicon carbide crystalline layer epitaxially grown thereon. In either case, the p− and n+ layers are then successively grown epitaxially over the body, with the n+ layer being appropriately patterned thereafter.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

To facilitate understanding, identical reference numerals have been used where appropriate to designate identical elements that are common to the figures.

DETAILED DESCRIPTION

After considering the following detailed description, those skilled in the art will recognize that the broad teachings of the invention can be readily utilized in a wide variety of semiconductor structures that suffer from corruption due to diffusion of a contact metal (or similarly highly conductive material) through a thin semiconductor layer while preserving the advantages associated with use of such a thin layer. For example, the invention can be used in conjunction with a wide variety of semiconductor technologies, such as, illustratively, silicon, silicon carbide or gallium arsenide, and in forming a wide variety of different devices including, specifically, photodiodes and light emitting diodes. The invention is particularly advantageous for silicon carbide photodiodes and therefore, to simplify the following discussion, the invention is described in the context of a 6H type silicon carbide photodiode.

Figure 1:
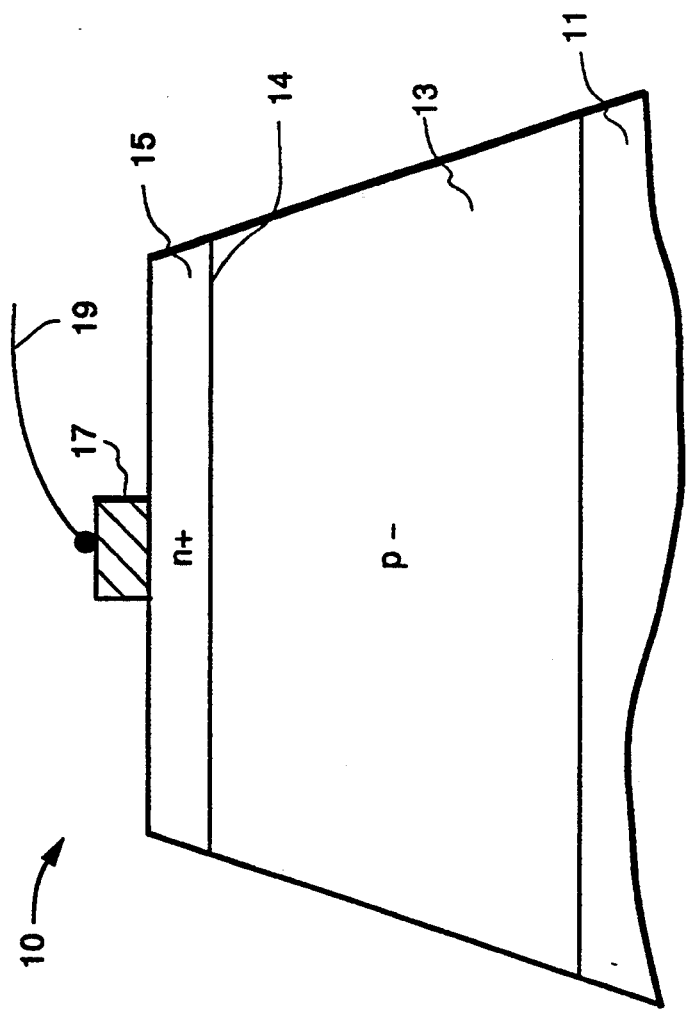
FIG. 1 is a cross-sectional view of a silicon carbide photodiode known in the art.

FIG. 1 is a cross-sectional view of a silicon carbide photodiode 10 known in the art. This photodiode, formed by epitaxial growth, is comprised of a series of layers grown on a p type or n type conductivity substrate 11. This substrate, as well as all the semiconductor layers grown thereon, comprises appropriately doped 6H type crystalline silicon carbide. Initially, a layer 13, generally between 1 and 5 $\mu$m in thickness, is grown on the substrate and is lightly doped with aluminum to form a p− layer. Thickness of layer 13 determines sensitivity of the photodiode to optical wavelengths between 300 and 400 nm. After layer 13 is fabricated, a layer 15 is epitaxially grown thereon. Layer 15 is heavily doped with nitrogen to n+ conductivity, forming a p−/n+ junction 14 between layers 13 and 15, each of which has uniform thickness.

After n+ layer 15 has been formed, a suitable silicon dioxide (SiO$_2$) passivation layer (not shown) is deposited onto the upper surface of n+ layer 15, and then etched back to expose a contact region on layer 15. This passivation layer is transparent to ultraviolet wavelengths. An upper metal contact 17 is then formed by alloying or sintering a localized metallic layer, typically nickel, onto the exposed contact region of layer 15. A wire lead 19 is then bonded to layer 17. A bottom contact is typically made through a metallic layer to a rear surface (both of which are not shown) of p type substrate 11. Inasmuch as dopant concentrations needed to fabricate the various epitaxial layers that form photodiode 10, as well as the inventive photodiodes discussed below, are all well known in the art, these levels will not be discussed in any detail herein.

It is known in the art that, to maximize short-wavelength ultraviolet response, n+ layer 15 must be quite thin, typically on the order of 1000 Angstroms (0.1 $\mu$m) or less in thickness. However, during the course of sintering or alloying upper contact layer 17 onto n+ layer 15, nickel from the contact layer can seek out and diffuse into crystalline defects within n+ layer 15. Because the n+ layer is quite thin, nickel will migrate into the vicinity of p−/n+ junction 14 and can degrade or locally short circuit the junction. This contact spiking phenomenon imbues photodiode 10 with an excessively large reverse leakage dark current which renders it unsuitable for use in a number of applications, such as for an accurate flame detector in a jet engine or similar high temperature system. Making n+ layer 15 quite thick, generally several thousand Angstroms, would avoid contact spiking; however, doing so would result in reduction of the diode short wavelength response in the ultraviolet spectrum and possibly, depending upon the particular thickness chosen, to the point where the short wavelength response would completely disappear. Accordingly, the thickness required to prevent contact spiking has heretofore prevented optimization of the short wavelength (less than approximately 280 nm) response of silicon carbide photodiodes.

Advantageously, we have discovered that the photodiode limitations of contact spiking can be overcome and the short-wavelength ultraviolet sensitivity can be improved by substantially increasing the n+ layer thickness beneath the upper metallic contact layer, while maintaining this n+ layer relatively thin elsewhere along the top of the p− layer. Since the total portion of the n+ layer requiring increased thickness accounts for only a relatively small percentage (typically less than 1% but possibly up to 10%) of the total upper surface area on this layer, the reduced optical short-wavelength sensitivity that would otherwise result from the increased thickness of this layer is essentially negligible when limited to the upper contact region. Optical sensitivity is therefore essentially determined by the thin portions of the n+ layer, while the increased thickness of this layer under the upper contact is sufficiently large to prevent contact layer metal from diffusing into the region of the p−/n+ junction during contact sintering or alloying operations, thereby assuring that the photodiode has very low leakage current. The n+ layer is fabricated by epitaxially growing a uniformly thick n+ layer over the p− layer and then selectively patterning the n+ layer, typically by photochemical etching, in order to reduce the n+ layer thickness except where the layer will directly support the upper metallic contact layer. A passivation layer, such as SiO$_2$, is next formed over the structure and then etched back to expose a suitable contact area. The upper metallic contact layer is formed on the exposed portion of the unetched mesa or thick region of the n+ layer.

Figure 2:
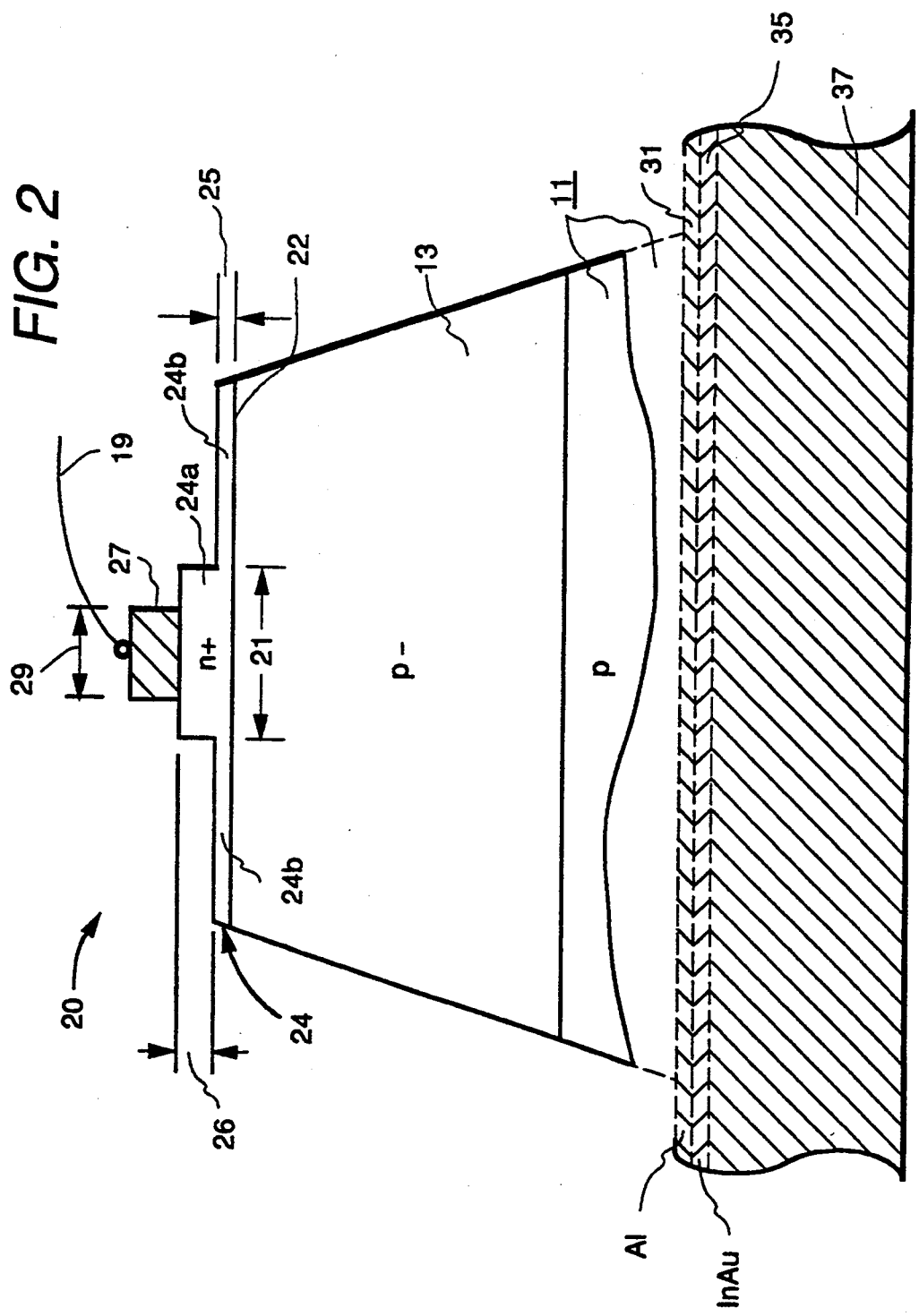
FIG. 2 is a cross-sectional view of one embodiment of the silicon carbide photodiode of the invention.

FIG. 2 is a cross-sectional view of one embodiment of the inventive silicon carbide photodiode 20 which is formed on p type conductivity silicon carbide crystalline substrate 11, with p− layer 13 epitaxially deposited on substrate 11. The p− layer 13 thickness is appropriately made equal to or less than 5 $\mu$m and preferably between 1 and 5 $\mu$m, to selectively vary sensitivity of the photodiode between 300 and 400 nm. Owing to the relatively low coefficient of optical absorption of silicon carbide, the absorption and resulting response of the photodiode to longer wavelengths (i.e., between 200 and 400 nm) can be increased by making layer 13 relatively thick. Conversely, to make the photodiode essentially insensitive to these longer wavelengths, p− layer 13 should be made relatively thin.

An n+ layer 24 is next formed by epitaxially growing a uniformly thick silicon carbide layer, heavily doped with nitrogen, over the entire p− layer. Layer 24 should be grown to a total thickness of between 3000 and 4000 Angstroms to adequately prevent upper contact layer 27 metal from subsequently diffusing into the vicinity of a p−/n+ junction 22 between layers 13 and 24 during contact sintering when ambient temperature is between 900° and 1000° C. Once the n+ layer has been formed to this thickness, it is selectively patterned to reduce its thickness 25 to a predetermined minimum, typically less than 1000 Angstroms, everywhere other than at region 24a where it will carry upper contact metallization. The resulting n+ layer 24 includes mesa structure 24a and reduced thickness (i.e., "thinned") regions 24b. As such, layer 24 is relatively thin over most of its area, providing sufficient short-wavelength ultraviolet radiation sensitivity, while region 24a is of thickness 26, typically a factor of 2–6 or more greater than thickness 25 of region 24b, under upper contact layer 27 to prevent contact spiking. An SiO₂ passivation layer is next formed over the entire n+ layer 24 and then selectively etched back over mesa structure 24a to expose the entire upper contact region. (For simplicity of illustration, the passivation layer is not shown.) Thereafter, a metallization layer, such as nickel, is appropriately alloyed or sintered onto the now-exposed top surface of structure 24a to form upper contact layer 27.

At typical and illustrative device measurements, n+ layer 24 is sized on the order of approximately 2–3 mm/side to present a total upper device surface area of 4–9 mm² for photodiode 20. The width 21 of mesa structure 24a (this width being shown grossly exaggerated for purposes of illustration) is only slightly larger than the width 29 of metallization 27 to account for expected alignment tolerances in etching back the passivation layer and forming upper contact layer 27. Metallization 27, also shown grossly exaggerated, has a uniform width 29 typically on the order of 10 μm, though this dimension is not critical.

P type conductivity substrate 11, having a typical thickness of 0.4 mm (approximately 0.015″), is affixed onto a layer of aluminum which serves as a back contact layer 31 for the photodiode. The back contact layer is bonded, through use of a well-known indium-gold bonding layer 35, to a Kovar metal alloy header structure 37. For purposes of illustration, substrate 11 and layers 31 and 35 are shown grossly exaggerated in thickness. The thicknesses of heavily doped p type substrate 11, contact layer 31, bonding layer 35 and header 37 are not critical.

Figure 3:
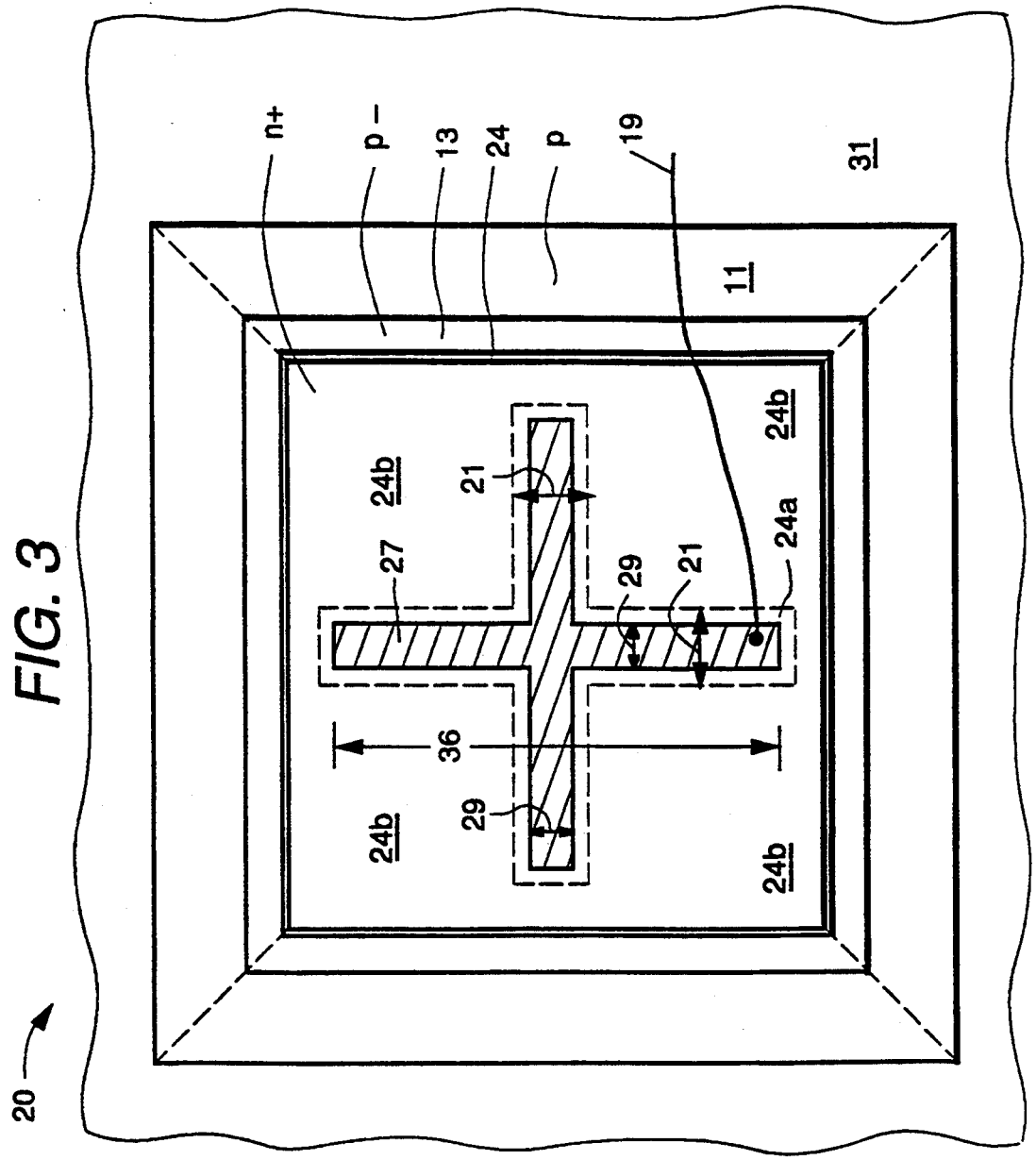
FIG. 3 is a top view of the silicon carbide photodiode shown in FIG. 2.

FIG. 3, a top view of silicon carbide photodiode 20 shown in FIG. 2, shows photodiode 20 as presenting a square top surface to incident optical radiation. Each side of the photodiode is equal in size at, illustratively, between 2 and 3 mm. Mesa structure 24a, which may conveniently be cross-shaped, and takes up no more than about 10% of the upper surface of n+ layer 24, is generally centered on n+ layer 24. Upper contact layer 27, which is also preferably cross-shaped but with slightly shorter and thinner vertical and horizontal arms, is situated on mesa structure 24a. Each contact arm is on the order of 10 μm in width 29 and on the order of 1.5–2 mm in length 36.

To simplistically illustrate the negligible effect which the entire enlarged n+ region has on optical sensitivity of the inventive photodiode, assume that each side dimension of the photodiode, measured at the top of layer 24, is illustratively 2 mm and that each arm of the elevated mesa structure is illustratively 12 μm wide and 1.6 mm long. This mesa structure will readily accommodate a metal contact layer having two centrally intersecting arms, each being 1.5 mm long and 10 μm wide. With these dimensions, the surface area of the n+ layer associated with mesa structure 24a is on the order of approximately 1% [or (2×12 μm×1.6 mm)/4 mm²] of the total surface area of n+ layer 24. In this example, the slight area coverage attributable to the thickened portions of n+ layer 24, i.e. mesa structure 24a, would likely diminish the short-wavelength sensitivity by no more than approximately 1% which, for all practical purposes, is negligible. Thus the sensitivity of the device is governed by the thickness of the thinned regions, i.e. regions 24b, of n+ layer 24. Moreover, the mesa structure, being situated directly under the metallization layer, will substantially, if not completely, preclude contact spiking and thereby yield a photodiode with very low leakage current.

Figure 4:
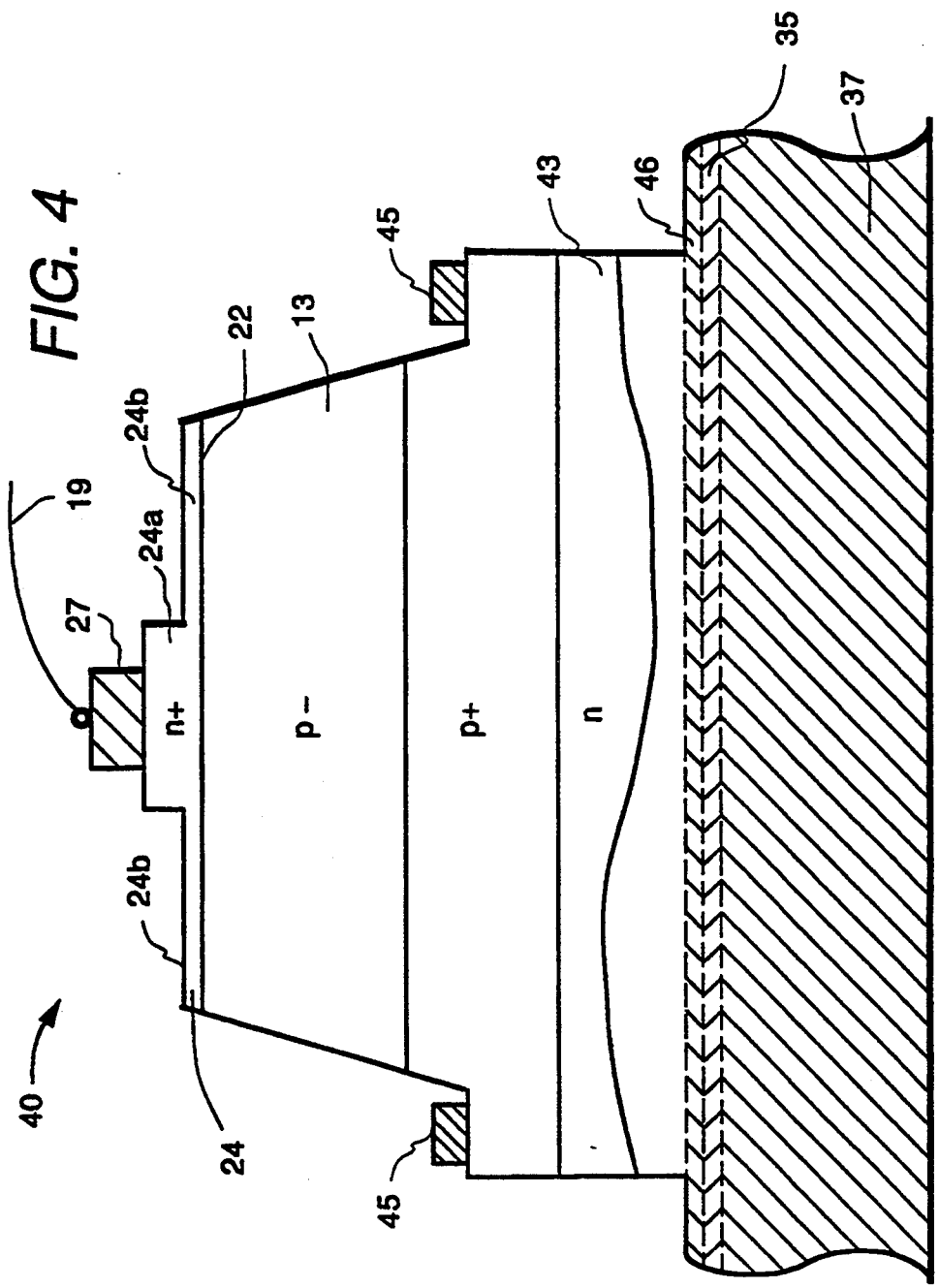
FIG. 4 is a cross-sectional view of another embodiment of the silicon carbide photodiode of the invention.

While FIGS. 2 and 3 each depict a p type conductivity substrate embodiment of the inventive photodiode, FIG. 4 is a cross-sectional view of an embodiment of the inventive photodiode constructed with an n type conductivity substrate. As shown, a heavily doped p+ layer 41 is epitaxially grown on an n type substrate 43 to collectively form a silicon carbide crystalline body. Thereafter, p− and n+ layers 13 and 24, respectively, are successively epitaxially grown over the p+ layer to define p−/n+ junction 22. N+ layer 24 is then selectively patterned back, as described above, to again produce cross-shaped mesa structure 24a (to serve as an elevated support for the metallization that will form the upper contact layer) and thinned regions 24b. Next, a SiO₂ passivation layer (not shown) is formed over the entire photodiode and appropriately patterned back to expose the entire top contact area. Thereafter, a nickel metallization layer is applied, through alloying or sintering, onto the exposed mesa structure to form upper metallic contact layer 27. A ring-shaped aluminum metallization layer 45 is also applied, as by sputtering, onto p+ layer 41 to form a second contact 45.

N type conductivity substrate 43 is fixedly mounted on a nickel layer 46. This layer is bonded, through an indium-gold bonding layer 35, to a Kovar header structure 37. The thicknesses of substrate 43, layer 46, bonding layer 35 and the header are not critical.

We have found that, as predicted, the inventive photodiodes with either n type or p type 6H substrates, though with p− and n+ silicon carbide epitaxial layers of differing thickness, exhibited excellent short wavelength sensitivity to ultraviolet radiation and very low reverse leakage current, approximately 10 nA/cm² of leakage current at 300° C. In view of these results, silicon carbide photodiodes embodying the invention should advantageously be expected to find widespread use in a variety of high temperature applications including, for example, use as flame detectors in jet engines.

Figure 5:
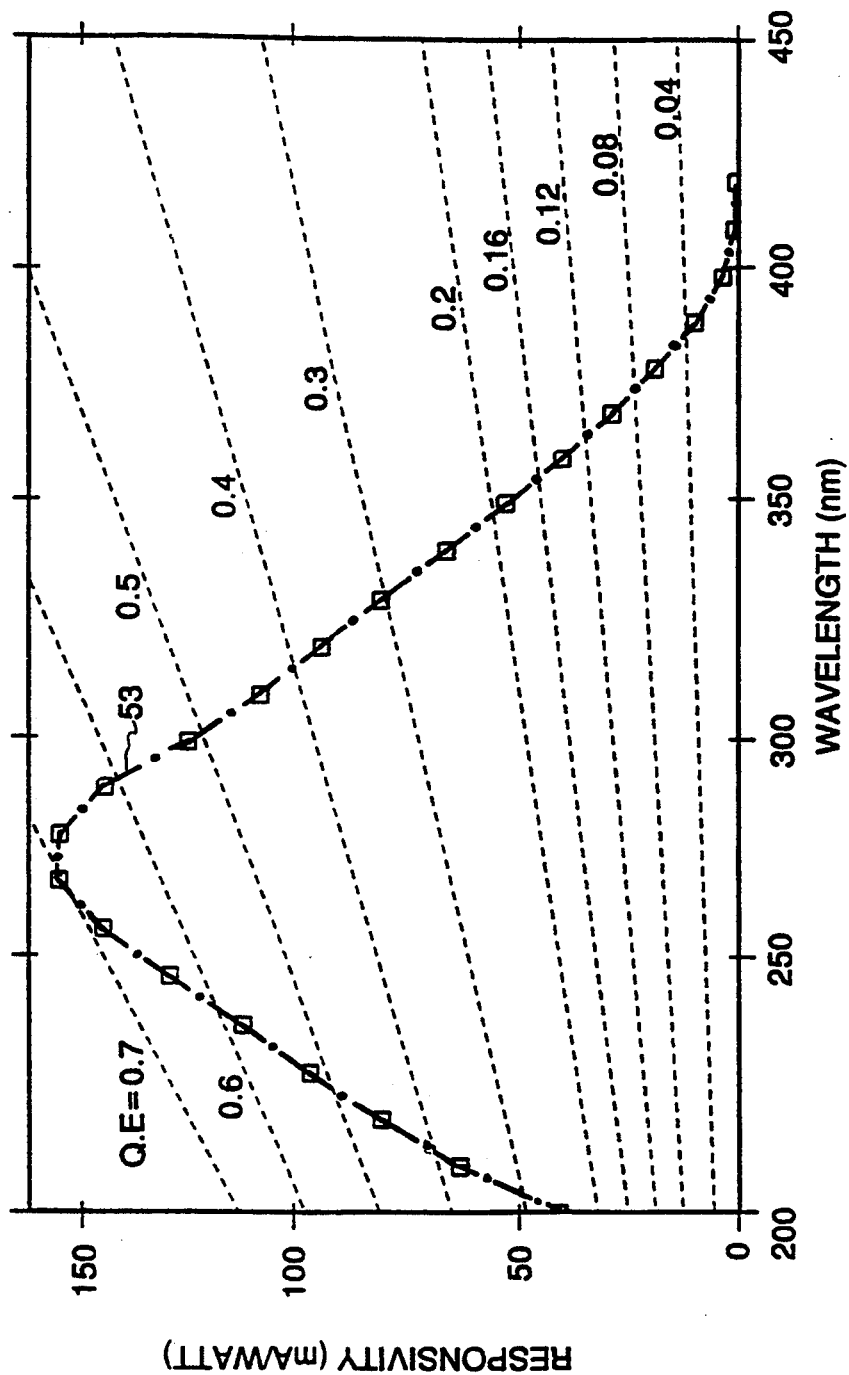
FIG. 5 is a graphical illustration of measured spectral responsivity and quantum efficiency as a function of applied optical wavelength for an actual photodiode of the type shown in FIG. 2.

FIG. 5 graphically depicts measured spectral responsivity and quantum efficiency (Q.E.) as a function of applied optical wavelength for one of the inventive photodiodes fabricated with a p type conductivity 6H crystalline substrate. For this particular photodiode, p− layer 13 (FIG. 2) was 5 μm thick, and n+ layer 24 was patterned to a total thickness directly under upper contact 27 of 3000 Angstroms and a thickness of 0.050 μm (500 Angstroms) elsewhere. Hence, in this photodiode, the top of mesa structure 24a was situated 2500 Angstroms above the surface of thinned n+ regions 24b. A 0.05 μm SiO₂ passivation layer was also used. As can be seen from curve 53 in FIG. 5, the response of this photodiode is quite sharp, and peaks at approximately 280 nm, with good sensitivity even at 200 nm.

Figure 6:
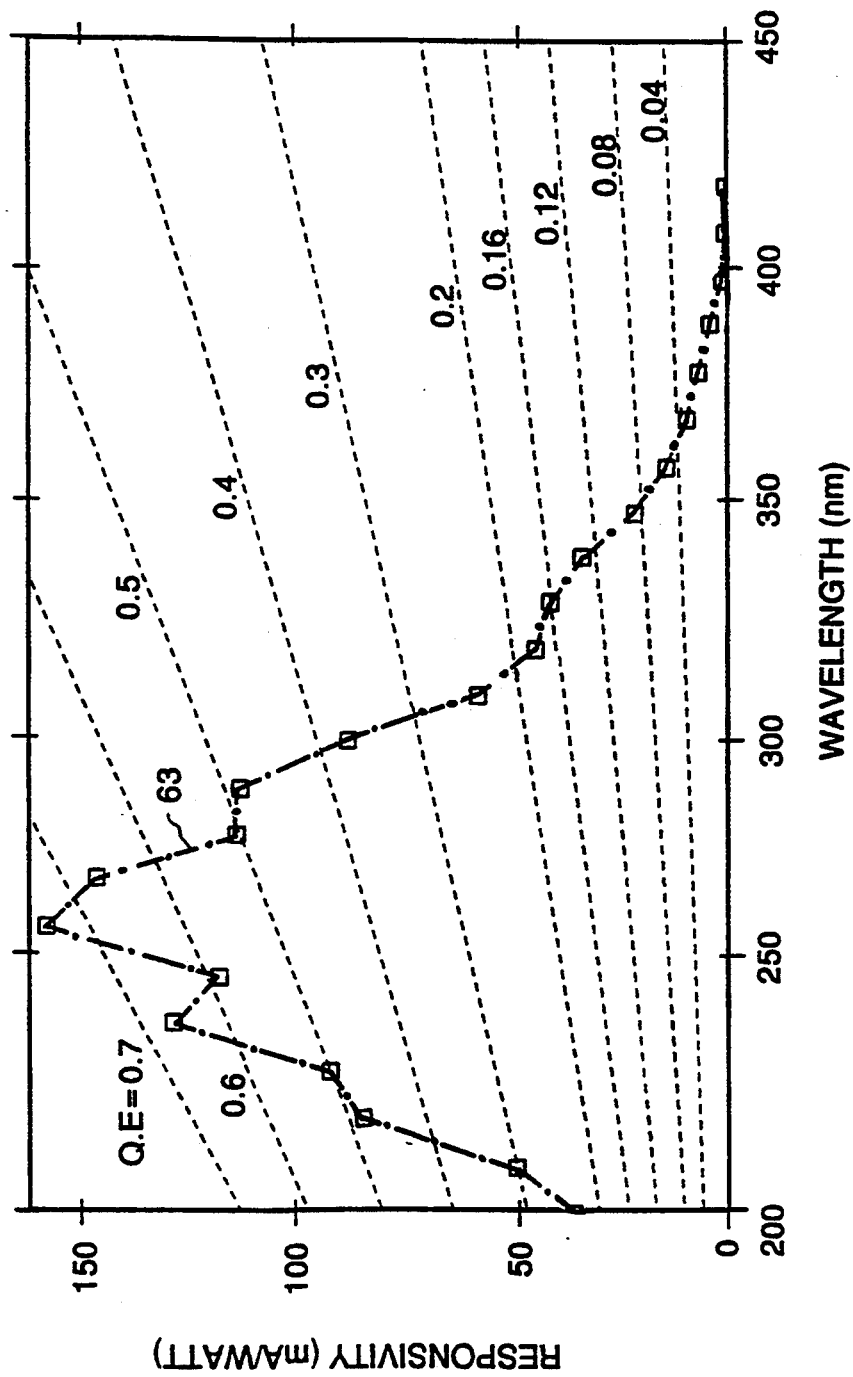
FIG. 6 is a graphical illustration of measured spectral responsivity and quantum efficiency as a function of applied optical wavelength for an actual photodiode of the type shown in FIG. 4.

FIG. 6 graphically depicts measured spectral responsivity and quantum efficiency (Q.E.) as a function of applied optical wavelength for one of the inventive photodiodes fabricated with an n type conductivity 6H crystalline substrate. Here, p+ layer 41 (FIG. 4) and p− layer 13 were each fabricated with a 1 μm thickness, and n+ layer 24 was patterned to have a total thickness of 3000 Angstroms beneath upper contact layer 27 and a thickness of 0.075 μm (750 Angstroms) elsewhere. Hence, in this photodiode, the top of mesa structure 24a was situated 2250 Angstroms above the surface of thinned n+ regions 24b. A 0.06 μm SiO₂ passivation layer was also employed. As apparent from curve 63 in FIG. 6, the response of this photodiode is also quite sharp, and peaks at approximately 260 nm. The jagged shape of curve 63 is due to use of a thickened passivation layer. As expected, the decrease in thickness of p− layer 13 shifted the peak in curve 63 of FIG. 6 toward increasingly short wavelengths relative to the position of the peak in curve 53 of FIG. 5.

Those skilled in the art will now recognize that although n+ layer 24 and p− layer 13 are preferably equal in width, they need not be. Furthermore, although upper contact layer 27 is cross-shaped and provides excellent performance, this contact layer can be fabricated in any one of a wide variety of different shapes, provided that enlarged thickness region 24a has the same shape but with a mesa-shaped cross section to effectively prevent the upper contact from causing contact spiking. Furthermore, the invention can be utilized in any crystalline form of silicon carbide, such as illustratively 3C, and not just 6H form. In addition, although n+ layer 24 has been described as being epitaxially grown on p− layer 13, this layer could alternatively be formed by first using ion implantation, with high implantation energy to form a relatively deep n+ region in layer 13, and then appropriately etching back the resulting n+ layer to form mesa structure 24a.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

We claim:

1. A semiconductor photodiode comprising:
   a crystalline body of silicon carbide;
   a lower metallic layer in contact with said body;
   a first crystalline layer comprising silicon carbide of a first conductivity type epitaxially grown on the body;
   a second crystalline layer of silicon carbide uniformly doped to a second conductivity type, opposite from the first type, and situated on the first layer, thereby forming a junction between the first and second layers;
   an upper metallic contact layer situated on a predetermined surface region of said second layer oppositely situated from the junction;
   the second layer having predetermined uniform minimum thickness everywhere except for a predetermined greater thickness beneath said surface region; and
   wherein the predetermined greater thickness of the second layer is greater than or equal to 2000 Angstroms and the predetermined uniform minimum thickness thereof is equal to or less than 1000 Angstroms.

2. The semiconductor photodiode of claim 1 wherein the predetermined greater thickness of the second layer is between 3000 and 4000 Angstroms inclusive and the predetermined uniform minimum thickness thereof is equal to or less than 1000 Angstroms.

3. The semiconductor photodiode of claim 2 wherein said surface region of said second layer occupies no more than 1% of the total area of said surface of said second layer.

4. The semiconductor photodiode of claim 2 wherein said surface region of said second layer occupies no more than 10% of the total surface area of the second layer.

5. The semiconductor photodiode of claim 4 wherein the first and second conductivity types are p− and n+, respectively.

6. The semiconductor photodiode of claim 5 wherein the crystalline body comprises a substrate of p type conductivity silicon carbide.

7. The semiconductor photodiode of claim 5 wherein the crystalline body comprises a substrate of n type conductivity sillicon carbide and a p+ silicon carbide crystalline layer epitaxially grown thereover, said lower metallic layer being situated on said p+ silicon carbide crystalline layer.

8. The semiconductor photodiode of claim 7 wherein the first layer is equal to or less than 5 $\mu$m in thickness.

9. The semiconductor photodiode of claim 8 wherein said surface region of said second layer is cross-shaped with two substantially equally sized and centrally intersecting arms.

10. The semiconductor photodiode of claim 9 wherein the second layer upper surface is square shaped with each side thereof having a dimension between 2 and 3 mm and wherein each arm of the upper metallic contact layer is equal to or less than 10 $\mu$m in width.

11. The semiconductor photodiode of claim 7 wherein said surface region of said second layer is centrally located on said second layer.

12. The semiconductor photodiode of claim 7 wherein the crystalline body and the crystalline layers epitaxially grown thereon comprise 6H type silicon carbide.

13. The semiconductor photodiode of claim 7 wherein the crystalline body and the crystalline layers epitaxially grown thereon comprise 3C silicon carbide.

14. The semiconductor photodiode of claim 4 wherein the first layer is equal to or less than 5 $\mu$m in thickness.

15. The semiconductor photodiode of claim 14 wherein said surface region of said second layer is cross-shaped with two substantially equally sized and centrally intersecting arms.

16. The semiconductor photodiode of claim 15 wherein the second layer upper surface is square shaped with each side thereof having a dimension between 2 and 3 mm and wherein each arm of the upper metallic contact layer is equal to or less than 10 $\mu$m in width.

17. The semiconductor photodiode of claim 4 wherein said surface region of said second layer is centrally located on said second layer.

18. The semiconductor photodiode of claim 4 wherein the crystalline body and the crystalline layers epitaxially grown thereon comprise 6H type silicon carbide.

19. The semiconductor photodiode of claim 4 wherein the crystalline body and the crystalline layers epitaxially grown thereon comprise 3C silicon carbide.

20. A semiconductor photodiode comprising:
    a crystalline body of silicon carbide;
    a lower metallic layer in contact with said body;
    a first crystalline layer comprising silicon carbide of a first conductivity type epitaxially grown on the body;
    a second crystalline layer of silicon carbide uniformly doped to a second conductivity type, opposite from the first type, and epitaxially grown on the first layer, thereby forming a junction between the first and second layers;

an upper metallic contact layer situated on a predetermined surface region of said second layer oppositely situated from the junction;

the second layer having predetermined uniform minimum thickness everywhere except for a predetermined greater thickness beneath said surface region; and wherein the predetermined greater thickness of the second layer is greater than or equal to 2000 Angstroms and the predetermined uniform minimum thickness thereof is equal to or less than 1000 Angstroms.

* * * * *